(12) United States Patent
Guo et al.

(10) Patent No.: US 12,389,555 B2
(45) Date of Patent: Aug. 12, 2025

(54) DISPLAY MODULE, METHOD FOR DISASSEMBLING/ASSEMBLING THEREOF, AND DISPLAY DEVICE

(71) Applicants: BOE MLED Technology Co., Ltd., Beijing (CN); BOE Technology Group Co., Ltd., Beijing (CN)

(72) Inventors: Shaofei Guo, Beijing (CN); Zhonghua Li, Beijing (CN); Shipeng Wang, Beijing (CN); Chao Tian, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/789,989

(22) PCT Filed: Sep. 29, 2021

(86) PCT No.: PCT/CN2021/121972
§ 371 (c)(1),
(2) Date: Jun. 29, 2022

(87) PCT Pub. No.: WO2023/050240
PCT Pub. Date: Apr. 6, 2023

(65) Prior Publication Data
US 2024/0188236 A1 Jun. 6, 2024

(51) Int. Cl.
*H05K 5/02* (2006.01)
*H05K 5/00* (2006.01)
(Continued)

(52) U.S. Cl.
CPC ......... *H05K 5/0217* (2013.01); *H05K 5/0018* (2022.08); *H05K 5/10* (2025.01); *H05K 5/30* (2025.01); *H05K 13/046* (2013.01)

(58) Field of Classification Search
CPC .. H05K 5/0217; H05K 5/0004; H05K 5/0018; H05K 5/0021; H05K 13/046; G09F 9/30
See application file for complete search history.

(56) References Cited

U.S. PATENT DOCUMENTS 10,495,255 B2 * 12/2019 Brashnyk ................. F16B 5/02
10,653,021 B2 *  5/2020 Kim ....................... G09F 9/3026
(Continued)

FOREIGN PATENT DOCUMENTS

CN  203114824 U  8/2013
CN  108492717 A  9/2018
(Continued)

*Primary Examiner* — Imani N Hayman
*Assistant Examiner* — Hung Q Dang
(74) *Attorney, Agent, or Firm* — IPro, PLLC

(57) ABSTRACT

A display module includes: a display substrate, having a display side and a back side opposite the display side; and a support assembly, stacked on the back side and including a support element, a first magnetic element and a drive element, wherein the first magnetic element and the drive element are both disposed on the support element, and the first magnetic element is connected to the drive element; wherein the first magnetic element is configured to be connected to a second magnetic element in a casing, and the drive element is configured to change a position of the first magnetic element relative to the support element.

20 Claims, 9 Drawing Sheets

(51) Int. Cl.
*H05K 5/10* (2025.01)
*H05K 5/30* (2025.01)
*H05K 13/04* (2006.01)

(56) References Cited

U.S. PATENT DOCUMENTS

| | | | |
|---|---|---|---|
| 10,653,023 B2* | 5/2020 | Habeck | H05K 5/0217 |
| 10,658,099 B2* | 5/2020 | Habeck | H05K 5/0021 |
| 11,706,882 B2* | 7/2023 | Kim | H05K 5/0017 |
| | | | 361/730 |
| 11,984,052 B2* | 5/2024 | Wang | G09F 9/33 |
| 2023/0240108 A1* | 7/2023 | Kim | G09F 9/3026 |

FOREIGN PATENT DOCUMENTS

| | | | | |
|---|---|---|---|---|
| CN | 211103710 | * | 7/2020 | ........... H05K 6/0217 |
| CN | 211103710 U | | 7/2020 | |
| CN | 112017554 A | | 12/2020 | |
| CN | 115376417 A | | 11/2022 | |
| JP | 2009053703 A | | 3/2009 | |
| KR | 20200144709 A | | 12/2020 | |

* cited by examiner

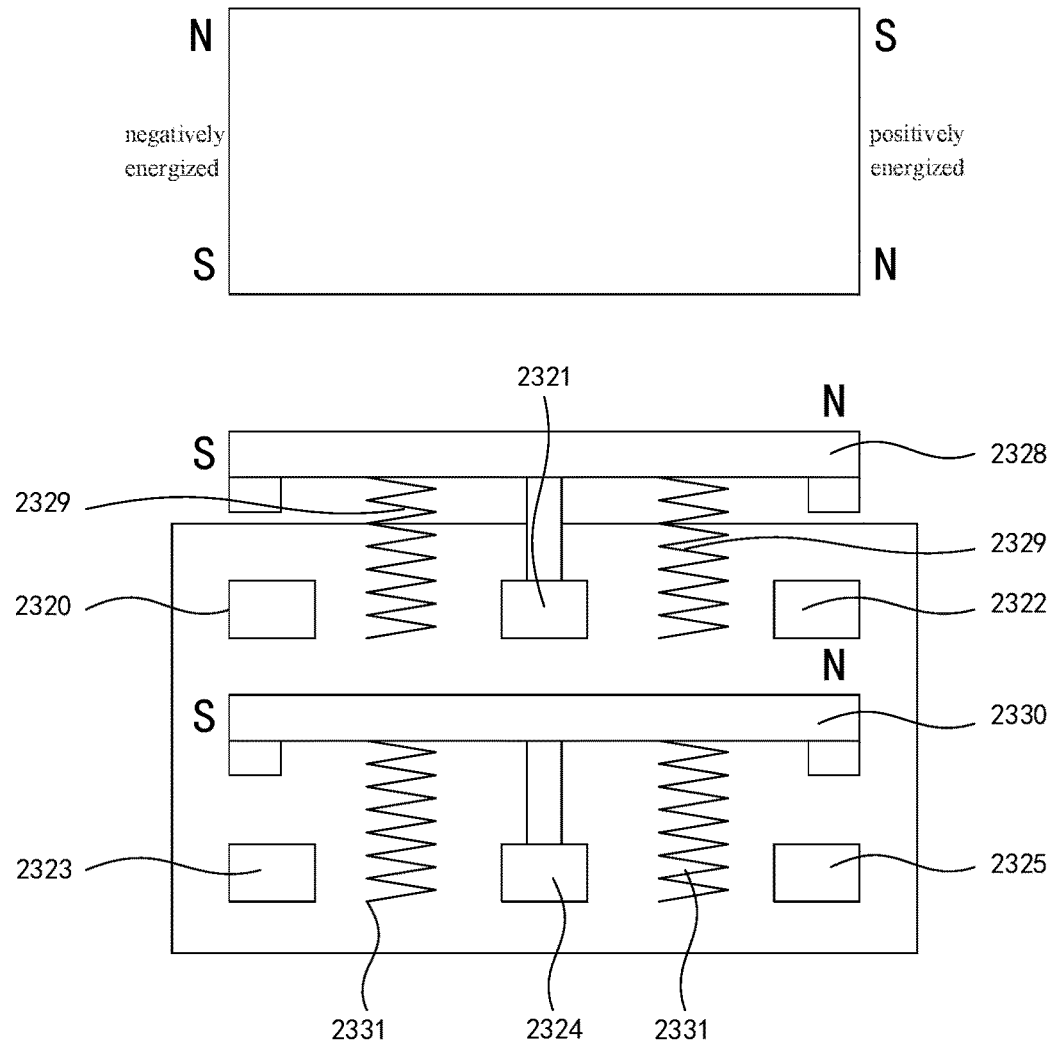

FIG. 12

| controlling, by the drive element, a position of the first magnetic element relative to the support element, such that the first magnetic element moves out of an initial position, wherein the initial position is a position where the display module is disposed on the casing and magnetically connected to the second magnetic element of the casing | S1301 |

| placing the display module on the casing or removing the display module from the casing | S1302 |

FIG. 13

DISPLAY MODULE, METHOD FOR DISASSEMBLING/ASSEMBLING THEREOF, AND DISPLAY DEVICE

CROSS-REFERENCE TO RELATED APPLICATION

This application is a US national phase application based on PCT/CN2021/121972, filed on Sep. 29, 2021, the disclosure of which is incorporated herein by reference in its entirety.

TECHNICAL FIELD

The present disclosure relates to the field of display and, in particular, relates to a display module, a method for disassembling/assembling thereof and a display device.

BACKGROUND

A stitching display device is a large size display device formed by stitching a plurality of display modules together, and the display surface of the stitching display device is larger, which can improve the viewing experience of customers. The stitching display device includes a plurality of display modules and a casing, and the plurality of display modules are stitched on the casing, thereby forming a larger size stitching display device.

SUMMARY

Embodiments of the present disclosure provide display module, a method, a method for disassembling/assembling thereof and a display device. The technical solution is as follows.

In a first aspect, a display module is provided. The display module includes: a display substrate, having a display side and a back side opposite the display side; and a support assembly, stacked on the back side and including a support element, a first magnetic element and a drive element, wherein the first magnetic element and the drive element are both disposed on the support element, and the first magnetic element is connected to the drive element; wherein the first magnetic element is configured to be connected to a second magnetic element in a casing, and the drive element is configured to change a position of the first magnetic element relative to the support element.

In some embodiments, the support element is a rectangular plate, and the support assembly includes four first magnetic elements and two drive elements, the four first magnetic elements being disposed on four corners of the support element respectively, and the two drive elements being disposed on two opposite sides of the support element respectively; wherein one of the two drive elements is connected to two of the four first magnetic elements and the other of the two drive elements is connected to the other two of the four first magnetic elements.

In some embodiments, the drive element is connected to the two first magnetic elements disposed on a side where the drive element is disposed.

In some embodiments, the drive element includes: a first fixed housing, disposed on a side, distal from the display substrate, of the support element, wherein the first fixed housing is fixedly connected to the support element, and the first fixed housing includes a first mounting cavity; a magnet, movably disposed within the first mounting cavity, wherein a moving direction of the magnet is perpendicular to the back side; a connection element, having flexibility and an elongated shape, wherein at least one end of the connection element is connected to the first magnetic element, and the connection element is in contact with a side, distal from the display substrate, of the magnet; and a first elastic resetting element, disposed between the first magnetic element and the first fixed housing, wherein both ends of the first resilient resetting element are abutted against the first magnetic element and the support element respectively.

In some embodiments, the drive element further includes: a guide bar, wherein one end of the guide bar is connected to an end of the connection element, the other end of the guide bar is connected to the first magnetic element, and the first elastic resetting element is sleeved on the guide bar.

In some embodiments, the drive element includes: a second fixed housing, disposed on a side, distal from the display substrate, of the support element, wherein the second fixed housing is fixedly connected to the support element, and the second fixed housing includes a second mounting cavity; a magnetic block, movably disposed within the second mounting cavity, wherein a moving direction of the magnetic block moving is perpendicular to the back side, and a surface, distal from the display side, of the magnetic block is a bevel surface; a sliding bar, wherein one end of the sliding bar is disposed on the bevel surface and the other end of the sliding bar is connected to the first magnetic element; a second elastic resetting element, disposed between the first magnetic element and the second fixed housing, wherein both ends of the second elastic resetting element are abutted against the first magnetic element and the support element respectively; and a third elastic resetting element, disposed within the second mounting cavity and between the magnetic block and the support element, wherein both ends of the third elastic resetting element are abutted against the magnetic block and the support element respectively.

In some embodiments, a chute is disposed in the bevel surface, and the drive element further includes: a roller, disposed within the second mounting cavity, wherein the roller is connected to one end of the sliding bar, and the roller is disposed in the chute.

In some embodiments, the drive element includes: a motor, disposed on a side, distal from the display substrate, of the support elements; a screw, wherein one end of the screw is coaxially connected to a drive shaft of the motor and the other end of the screw is in threaded to the first magnetic element; and a power supply, electrically connected to the motor.

In some embodiments, the drive element further includes: a control assembly, including a first pin, a second pin, a third pin, a fourth pin, a fifth pin, a sixth pin, a first lead and a second lead, wherein the first lead is electrically connected to the second pin and the power supply, and the second lead is electrically connected to the fifth pin and the power supply; wherein a positive pole of the power supply is electrically connected to the first pin and the sixth pin sequentially, and a negative pole of the power supply is electrically connected to the fourth pin and the third pin sequentially; in the case that the first pin is electrically connected to the second pin, and the fourth pin is electrically connected to the fifth pin, the motor is rotatable in a forward direction; and in the case that the third pin is electrically connected to the second pin, and the fifth pin is electrically connected to the sixth pin, the motor is rotatable in a reverse direction.

In some embodiments, the drive element further includes: a first link, wherein a middle portion of the first link is electrically connected to the second pin, and both ends of the first link are aligned with the first pin and the third pin respectively; two first springs, connected to the first link and disposed between the first pin and the third pin, wherein the second pin is disposed between the two first springs; a second link, wherein a middle portion of the second link is electrically connected to the fifth pin, and both ends of the second link are aligned with the fourth pin and the sixth pin respectively; and two second springs, connected to the second link and disposed between the fourth pin and the sixth pin, wherein the fourth pin is disposed between the two second springs; wherein a magnetic pole of the first link is the same as a magnetic pole of the second link have at an end disposed on an identical side, and the magnetic poles of opposite ends of the first link are opposite.

In some embodiments, a slot hole for the first magnetic element to slide therein is disposed on the support element, and one end of the first magnetic element is disposed in the slot hole.

In some embodiments, the slot hole is an oblong hole, and a length of the slot hole ranges from 10 mm to 20 mm.

In some embodiments, the first magnetic element is an iron nail.

In a second aspect, a method for disassembling/assembling a display module is provided. The method is applicable to disassembling/assembling the display module as described in any one of the above aspects. The method includes: controlling, by the drive element, a position of the first magnetic element relative to the support element, such that the first magnetic element moves out of an initial position, wherein the initial position is a position where the display module is disposed on the casing and magnetically connected to the second magnetic element of the casing; and placing the display module on the casing or removing the display module from the casing.

In a third aspect, a display device is provided. The display device includes a casing and a plurality of display modules, wherein at least one of the plurality of display modules is the display module as described in any one of the first aspect, and the plurality of display modules are stitched on the casing.

BRIEF DESCRIPTION OF THE DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

FIG. 12 is a schematic diagram of a structure of a control assembly according to an embodiment of the present disclosure;

FIG. 13 is a flowchart of a method for disassembling/assembling a display module according to an embodiment of the present disclosure.

DETAILED DESCRIPTION

For clearer descriptions of the objectives, technical solutions, and advantages of the present disclosure, the following further describes implementations of the present disclosure in detail with reference to the accompanying drawings.

In related art, the display module includes a stacked display substrate and a support assembly. The display substrate includes a plurality of components for displaying a screen. The support assembly supports the display substrate, and a first magnetic element is arranged in the support assembly. A second magnetic element is arranged in the casing, and when the display module is mounted on the casing, the position of the first magnetic element is aligned with the position of the second magnetic element, and the first magnetic element is magnetically connected to the second magnetic element, and the display module is fixed on the casing by magnetic attractive force between the first magnetic element and the second magnetic element.

In order to ensure the stability of the display module, the magnetic attractive force between the first magnetic element and the second magnetic element is larger. In this way, during assembly of the display module, when the display module is close to the casing, the display module is to be instantly attracted to the casing by the magnetic attractive force. The display module is easy to be bumped, resulting in damage to the display module.

Figure 1:
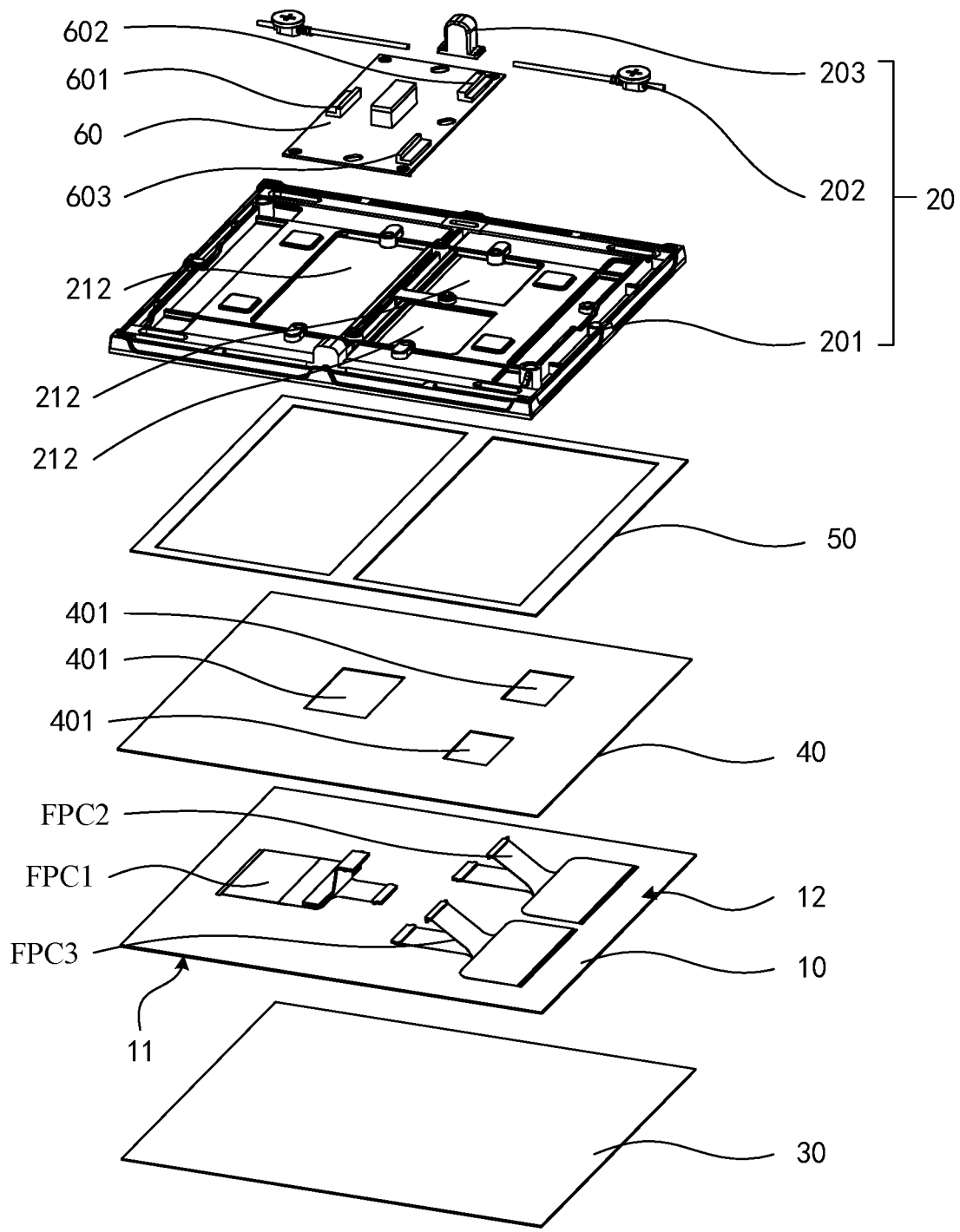
FIG. 1 is a schematic diagram of a structure of a display module according to an embodiment of the present disclosure.

FIG. 1 is a schematic diagram of an exploded structure of a display module according to an embodiment of the present disclosure. Referring to FIG. 1, the display module includes a display substrate 10 and a support assembly 20. The display substrate 10 has a display side 11 and a back side 12 opposite the display side 11.

The display substrate 10 is arrayed with a plurality of components, the components are disposed on the display side 11 of the display substrate 10, and the components are at least configured to display a screen.

Exemplarily, the material of the substrate in the display substrate 10 may be any of glass, quartz, polyimide (PI) or printed circuit board, plastic, etc.

Exemplarily, a component 101 is a mini light-emitting diode or a micro light-emitting diode, and the components are bound on the display substrate.

The support assembly 20 is stacked on the back side 12, and the support assembly 20 includes a support element 201, a first magnetic element 202, and a drive element 203. Both the first magnetic element 202 and the drive element 203 are disposed on the support element 201, and the first magnetic element 202 is connected to the drive element 203. The support element 201 is attached to the back side 12, the first magnetic element 202 is movably connected to the support element 201, and the drive element 203 is configured to change a position of the first magnetic element 202 relative to the support element 201.

The support assembly 20 supports the display substrate 10, and the support element 20 provides a mounting space for the first magnetic element 202 and the driver element 203.

In the embodiment, there is no magnetic attractive force between the support element 201 and the second magnetic element. In the case that the display module is mounted, the display module is not damage because the display module is not instantly attracted to the casing by the magnetic attractive force between the support element 201 and the second magnetic element.

Exemplarily, the support element 201 may be a metal plate layer. For example, the support element 201 is a die-cast aluminum layer or an aluminum alloy layer.

The first magnetic element 202 is configured to be magnetically connected to the second magnetic element in the casing, and the drive element 203 is configured to change the position of the first magnetic element 202 in the support element 201.

In the embodiment, the first magnetic element 202 in the display module is magnetically connected to the second magnetic element in the casing. In the case that the display module is mounted, the position of the first magnetic element 202 in the support element 201 is changed by the driving element 203, such that the position of the first magnetic element 202 is staggered from the position of the second magnetic element in the casing, and the magnetic attractive force between the first magnetic element 202 and the second magnetic element is reduced. In the case that the display module is close to the casing, the display module is not instantly attracted to the casing because of the larger magnetic attractive force, which can reduce the possibility of damage to the display module during the mounting process.

Referring again to FIG. 1, the display module also includes a protective film 30, a cooling photoresist layer 40, an adhesive layer 50, and a circuit connection structure 60. The protective film 30, the display substrate 10, the cooling photoresist layer 40, the adhesive layer 50, the support assembly 20, and the circuit connection structure 60 are sequentially stacked.

The protective film 30 prevents the display side of the display substrate 10 from being cut. The cooling photoresist layer 40 is configured to block the ambient light from the adhesive layer 50 side to avoid affecting the light output of the display module. The bonding layer 50 is configured to connect the support assembly 20 and the cooling photoresist layer 40. The circuit connection structure 60 is configured to connect to the circuit board on the casing.

Exemplarily, the protective film 30 may be black and a film layer with polyethylene terephthalate as a substrate. Both adjacent components have a protective film 30 between them, thereby avoiding adjacent components from affecting each other and improving the contrast of the display module.

Exemplarily, the cooling photoresist layer 40 may be a black graphite flake doped.

Exemplarily, the adhesive layer 50 may be a foam adhesive layer or an optical clear adhesive layer.

Exemplarily, the circuit connection structure 60 may be an interface switch board (e.g., a multi-port repeater HUB).

Referring again to FIG. 1, the display substrate 10 includes three flexible circuit boards FPC1, FPC2, and FPC3 disposed on the back side 12, and the first terminal 601, the second terminal 602, and the third terminal 603 in the circuit connection structure 60 are electrically connected to FPC1, FPC2, and FPC3 respectively. The casing has an interface electrically connected to the first terminal 601, the second terminal 602 and the third terminal 603 in the circuit connection structure 60, and the casing transmits electrical signals to the display substrate 10 through the circuit connection structure 60.

Referring again to FIG. 1, the support element 201 has three first openings 212 for FPC1, FPC2, and FPC3 to pass through. The cooling photoresist layer 40 has three second openings 401 for FPC1, FPC2, and FPC3 to pass through.

Figure 2:
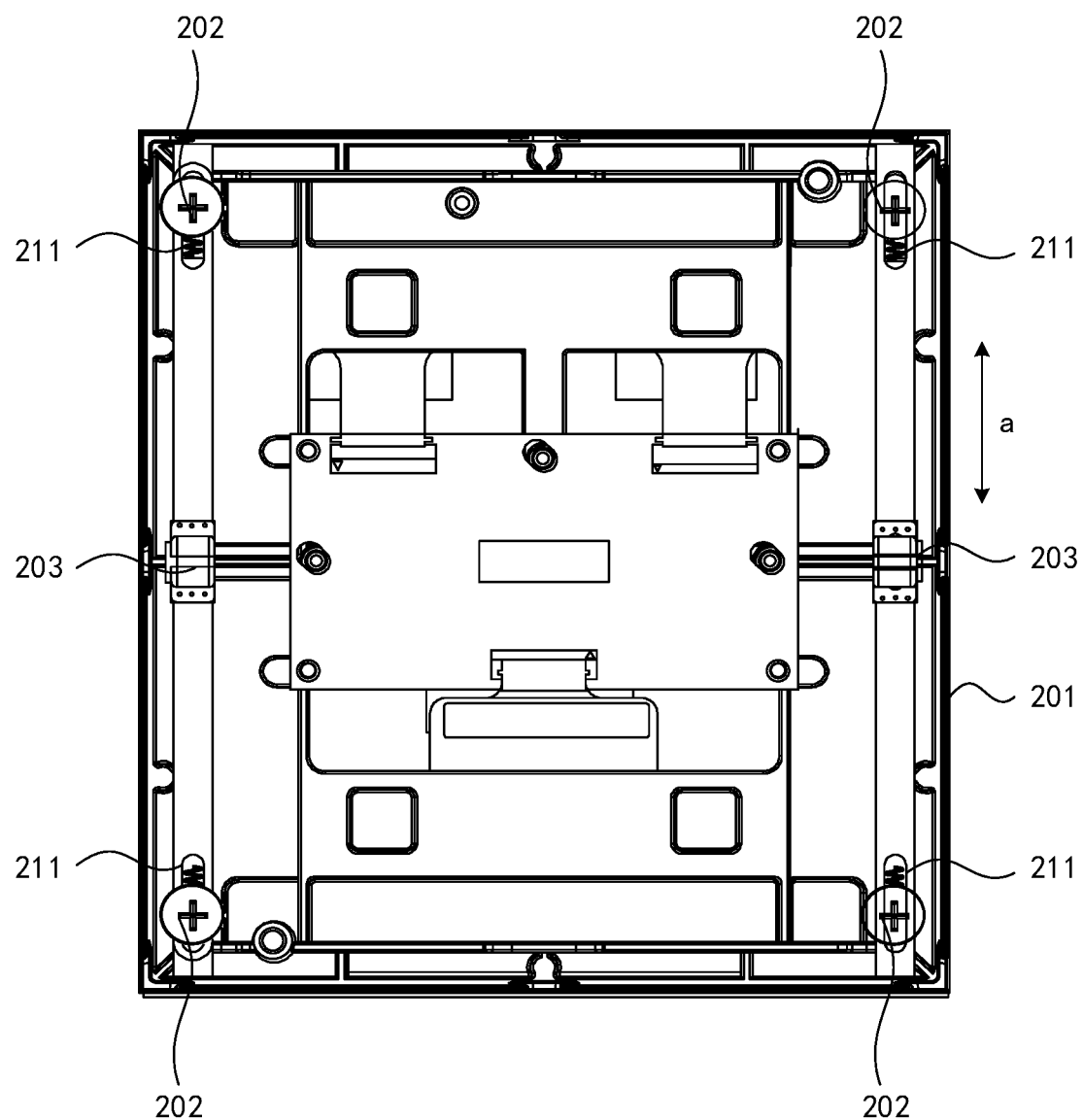
FIG. 2 is a schematic diagram of a structure of a support assembly according to an embodiment of the present disclosure.

FIG. 2 is a schematic diagram of a structure of a support assembly according to an embodiment of the present disclosure. Referring to FIG. 2, a shape of the support element 201 is rectangular. In the case that the display modules are stitched on the casing, the side edges of two adjacent display modules can fit together, making the interval between two adjacent display modules smaller, and in the case that the display module displays a screen, the interval between display surfaces is smaller to avoid affecting the display effect of the display device.

Referring again to FIG. 2, the support assembly 20 includes four first magnetic elements 202 and two drive elements 203. The four first magnetic elements 202 are disposed at the four corners of the support element 201 and the two drive elements 203 are disposed on opposite sides of the support element 201. One of the two drive elements 203 is connected to two of the four first magnetic elements 202, and the other of the two drive elements 203 is connected to the other two first magnetic elements 202 of the four first magnetic elements 202.

In the embodiment, the four first magnetic elements 202 are disposed at the four corners of the support element 201, and the four first magnetic elements 202 are also disposed at the four corners of the display module, such that the display module can be fixed from the four corners of the display module and tightness of the display module can be ensured. Meanwhile, by controlling two first magnetic elements 202 by one drive element 203, the quantity of drive elements 203 can be reduced and the structure of the display module can be simplified.

In other embodiments, the support assembly 20 may include other quantities of first magnetic elements 202 and drive elements 203. For example, the support assembly 20 includes four first magnetic elements 202 and four drive elements 203, and one drive element 203 is coupled to one first magnetic element 202.

In some embodiments, two first magnetic elements 202 connected to one drive element 203 are disposed along a first direction a, and the drive element 203 is disposed between the two first magnetic elements 202. The four first magnetic elements 202 are slidably connected to the support element 201, and the sliding direction of the four first magnetic elements 202 is parallel to the first direction a. That is, the driving element 203 is connected to the two first magnetic elements 202 disposed on the side where the driving element is disposed.

In some embodiments, the drive element 203 is disposed on the same side of the support element 201 as the two connected first magnetic elements 202. A drive element 203 is connected to the two first magnetic elements 202, and the drive element 203 controls the connected first magnetic elements 202 to slide in the first direction a, thereby changing the position of the first magnetic elements 202 in the support element 201.

In other embodiments, a drive element 203 may be connected to the two first magnetic elements 202 disposed at opposite corners.

Referring again to FIG. 2, a slot hole 211 for the first magnetic element 202 to slide is disposed on the support element 201, and one end of the first magnetic element 202 is disposed in the slot hole 211.

In the embodiment, the slot hole 211 is disposed in the support element 201 and the first magnetic element 202 can slide along the slot hole 211, thereby controlling the sliding direction of the first magnetic element 202.

Referring again to FIG. 2, the slot hole 211 is an oblong hole, and a length of the slot hole 211 ranges from 10 millimeters (mm) to 20 mm. The oblong hole is rectangular in the middle of the projection of the back side 12, and each of the two opposite sides of the rectangle is connected with a semicircle, the diameter of the semicircle is equal to the length of the connected side.

In the embodiment, the first magnetic element 202 slides in the slot hole 211, defining the length of the slot hole 211, i.e., defining a path in which the first magnetic element 202 can slide. It is ensured that the position of the first magnetic element 202 in the support element 201 can be changed and a larger slot hole 211 does not need to be arranged.

In some embodiments, the length of the display module ranges from 160 mm to 180 mm and the width of the display module ranges from 140 mm to 160 mm.

Exemplarily, the length of the display module is 170 mm and the width of the display module is 150 mm.

In some embodiments, the material of the first magnetic element 202 may be a tack including a ferromagnetic metal or ferromagnetic alloy material such as iron, nickel, cobalt, ferrous galvanized, stainless steel, etc., and the second magnetic element is a magnet. The magnet has a magnetic attractive force to an iron nail.

Figure 3:
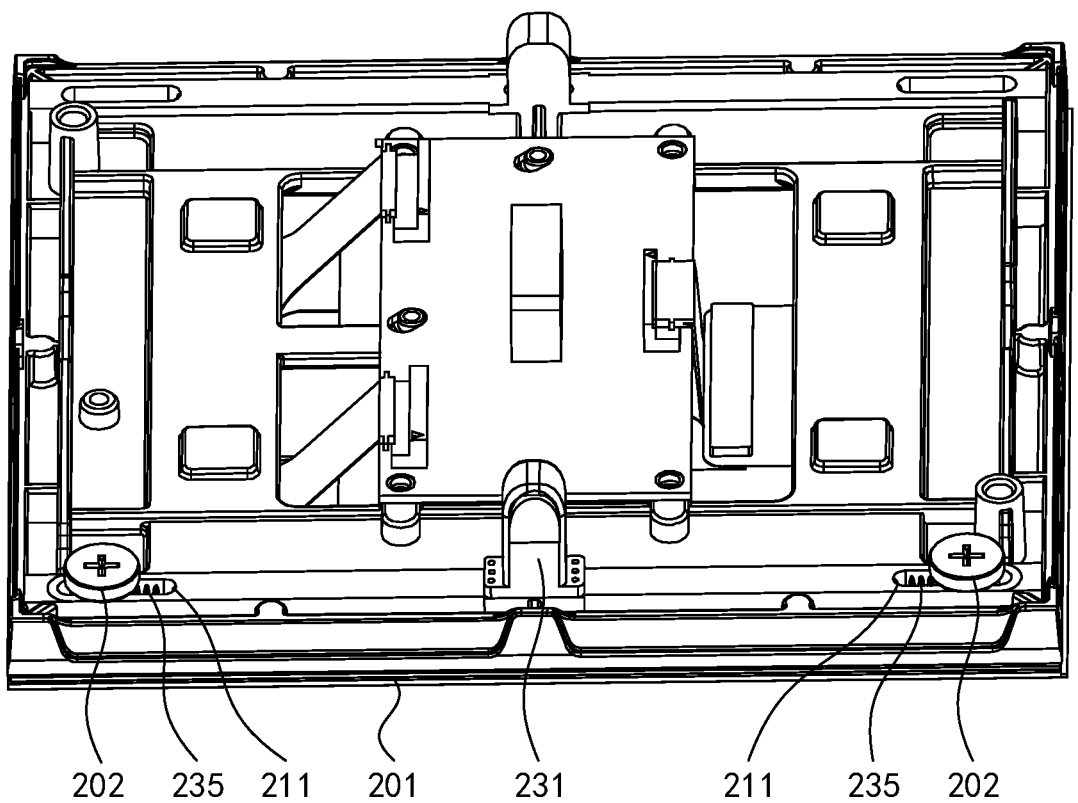
FIG. 3 is a schematic diagram of a structure of a display module according to an embodiment of the present disclosure.

FIG. 3 is a schematic diagram of the structure of a display module according to an embodiment of the present disclosure. Referring to FIG. 3, the drive element 203 includes a first fixed housing 231, disposed on a side, distal from the display substrate 10, of the support element 201, and the first fixed housing 231 is fixedly connected to the support element 201.

Figure 4:
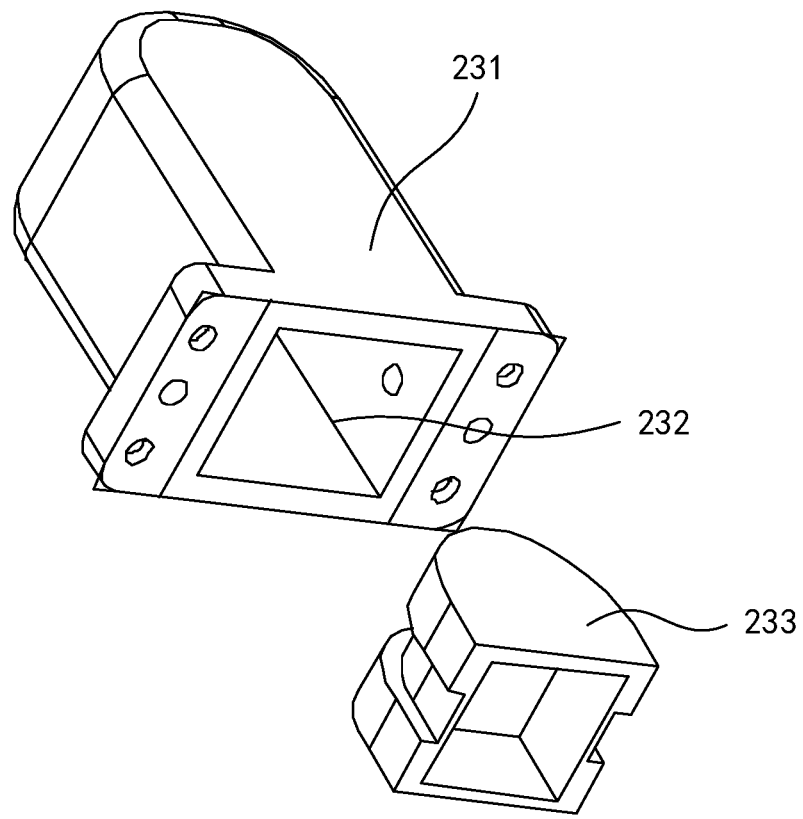
FIG. 4 is a schematic diagram of a structure of a first fixed housing according to an embodiment of the present disclosure.

FIG. 4 is a schematic diagram of the structure of a first fixed housing according to an embodiment of the present disclosure. Referring to FIG. 4, the first fixed housing 231 includes a first mounting cavity 232. The drive element 203 further includes a magnet 233, disposed within the first mounting cavity 232, the magnet 233 is slidable in the first mounting cavity 232, and the magnet 233 moves in a direction perpendicular to the display side 11.

Figure 5:
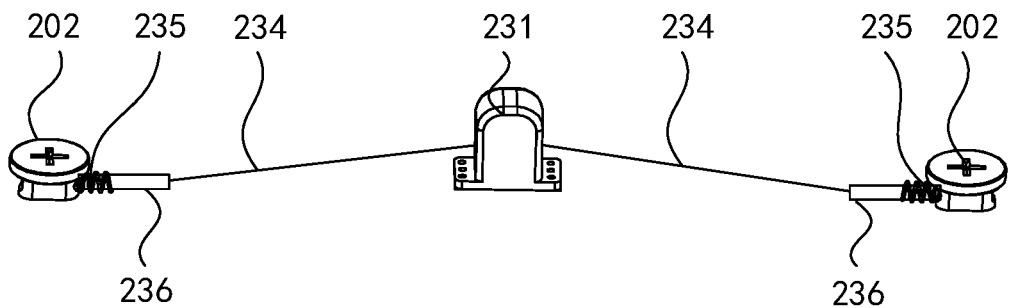
FIG. 5 is a schematic diagram of a structure of a drive element according to an embodiment of the present disclosure.

FIG. 5 is a schematic diagram of a structure of a drive element according to an embodiment of the present disclosure. Referring to FIG. 5, the drive element 203 further includes a connection element 234 and a first elastic resetting element 235. The connection element 234 has flexibility and an elongated shape, at least one end of the connection element 234 is connected to the first magnetic element 202, and the connection element 234 is in contact with a side, distal from the display substrate 10, of the magnet 233. The connection element 234 is flexible, also referred to as flexing. The first elastic resetting element 235 is disposed between the first magnetic element 202 and the first fixed housing 231, and both ends of the first elastic resetting element 235 are abutted against the first magnetic element 202 and the support element 201 respectively.

Figure 6:
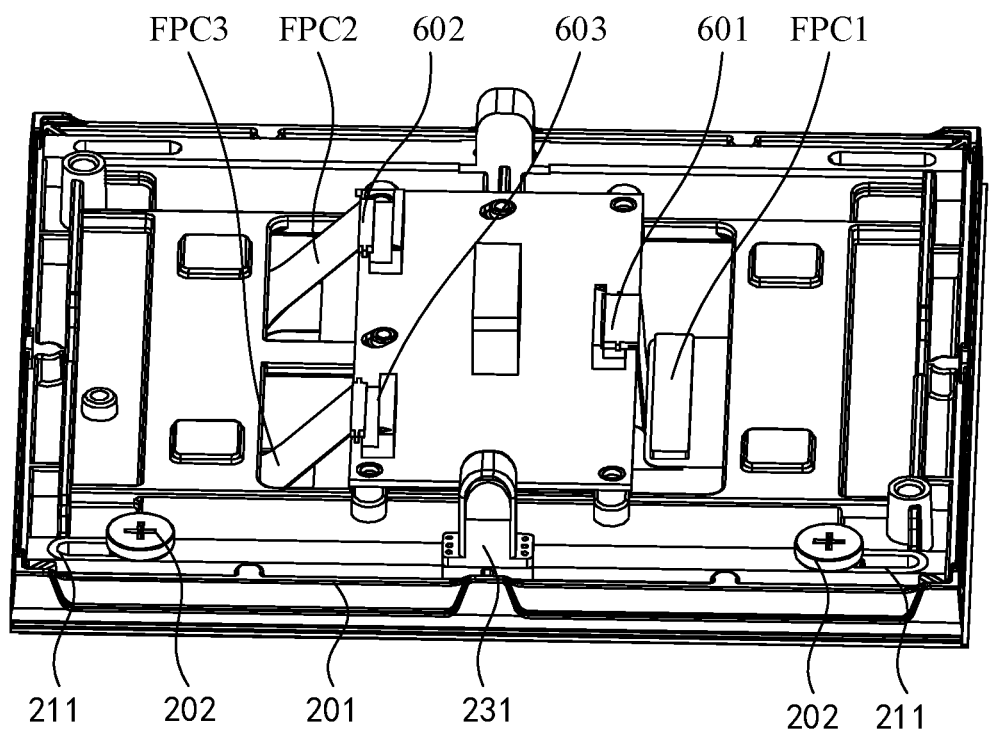
FIG. 6 is a schematic diagram of a structure of a display module according to an embodiment of the present disclosure.

In the embodiment, the drive element 203 can be driven by a mounting tool having magnetism. In the case that no display module is mounted, the magnet 233 is disposed at the bottom of the first mounting cavity 232 under the action of gravity. In the case that the display module needs to be mounted, the mounting tool having magnetism is attached to the display side 11 of the display substrate 10 and makes the two magnets of the same pole are aligned with each other. Under the action of repulsive force, the magnet 233 slides in the first mounting cavity 232 and slides toward the side distal from the display side. In the case that the magnet 233 slides, the magnet 233 pulls the connection element 234 such that the end of the connection element 234 connected to the first magnetic element 202 moves toward the first fixed housing 231, thereby pulling the first magnetic element 202 to move and changing the position of the first magnetic element 202 in the support element 201. FIG. 6 is a schematic diagram of the structure of a display module according to an embodiment of the present disclosure. Referring to FIG. 6, in this case, the first magnetic element 202 is disposed at the end of the slot hole 211 near the first fixed housing 231 under driven by the drive element 203.

In response to the display module being mounted, the mounting tool is removed from the display side 11, and the first magnetic element 202 is moved toward the side distal from the first fixed housing 231 under the action of the first elastic resetting element 235. In this case, the first magnetic element 202 is aligned with the second magnetic element in the casing, and the display module is fixed to the casing by magnetic attractive force.

Referring again to FIG. 5, the drive element 203 further includes a guide bar 236. One end of the guide bar 236 is connected to one end of the connection element 234, the other end of the guide bar 236 is connected to the first magnetic element 202, and the first elastic resetting element 235 is sleeved on the guide bar 236.

In some embodiments, the guide bar 236 is arranged to limit the moving direction of the first magnetic element 234.

Exemplarily, the guide bar 236 extends along the first direction a.

In FIG. 5, a drive element 203 includes a connection element 234. Both ends of the connection element 234 is connected to two first magnetic element 234 respectively.

In other embodiments, a drive element 203 includes two connection elements 234. One end of each connection element 234 is connected to a first magnetic element 202, and the other end of the connection element 234 is connected to a side, distal from the display substrate 10, of the magnet 233.

In some embodiments, the connection element 234 is a wire rope.

In some embodiments, the first elastic element 235 may be a compression spring.

In some embodiments, a channel for the wire rope to slide is arranged in the support element 201.

Figure 7:
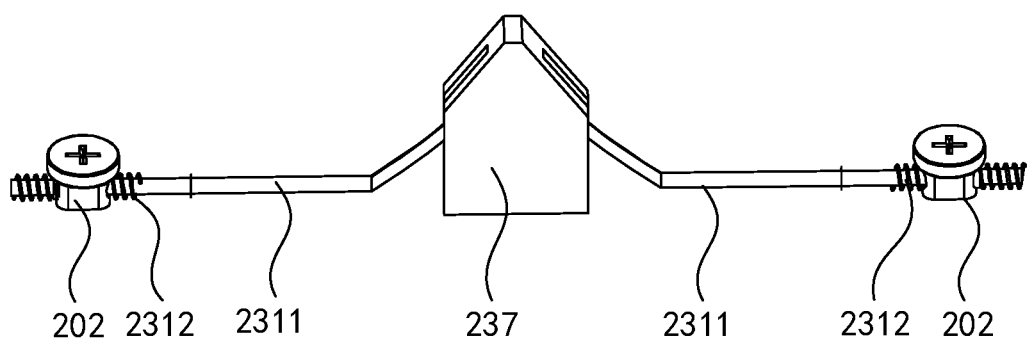
FIG. 7 is a schematic diagram of a structure of a display module according to an embodiment of the present disclosure.

FIG. 7 is a schematic diagram of the structure of a display module according to an embodiment of the present disclosure. Referring to FIG. 7, the drive element 203 includes a second fixed housing 237, a sliding bar 2311, and a second elastic resetting element 2312.

Figure 8:
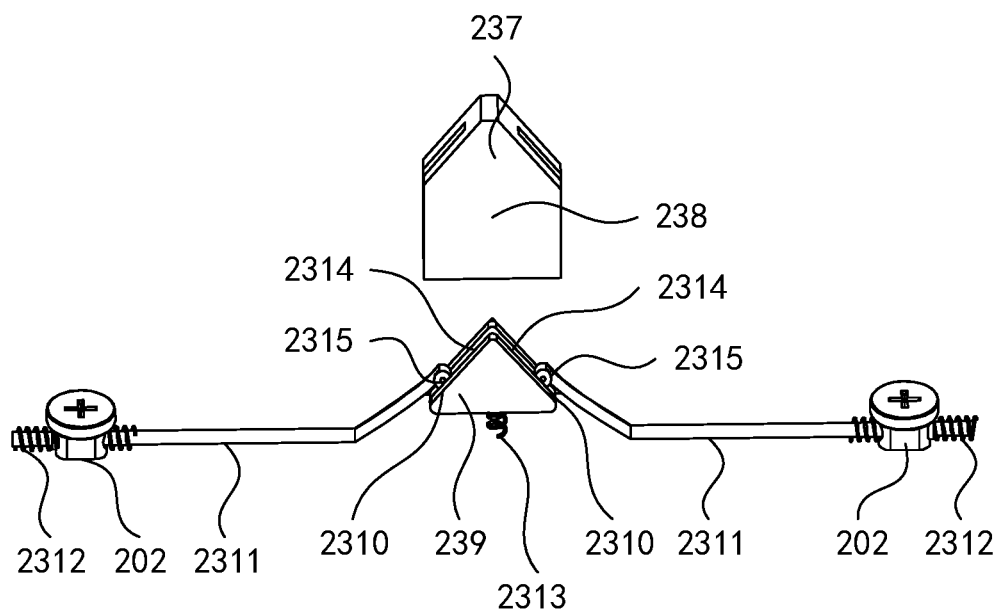
FIG. 8 is a schematic diagram of a structure of a drive element according to an embodiment of the present disclosure.

FIG. 8 is a schematic diagram of a structure of a drive element according to an embodiment of the present disclosure. Referring to FIG. 8, the drive element 203 further includes a magnetic block 239 and a third elastic resetting element 2313.

The second fixed housing 237 is disposed on a side, distal from the display substrate 10, of the support element 201, the second fixed housing 237 is fixedly connected to the support element 201, and the second fixed housing 237 includes a second mounting cavity 238. The magnetic block 239 is disposed within the second mounting cavity 238, and the magnetic block 239 is slidable in the second mounting cavity 238, and the moving direction of the magnetic block 239 is perpendicular to the display side 11, and a surface, distal from the display side 11, of the magnetic block 239 is a bevel surface 2310. One end of the sliding bar 2311 is disposed on the bevel surface 2310, and the other end of the sliding bar 2311 is connected to the first magnetic element 202. The second elastic resetting element 2312 is disposed between the first magnetic element 202 and the second fixed housing 237, and both ends of the second elastic resetting element 2312 are abutted against the first magnetic element 202 and the support element 201 respectively. The third elastic resetting element 2313 is disposed within the second mounting cavity 238 and between the magnetic block 239 and the support element 201, and both ends of the third elastic resetting element 2313 are abutted against the magnetic block 239 and the inner side wall of the second fixed housing 237 respectively.

In the embodiment, the drive element 203 can also be driven by a mounting tool having magnetism. In the case that the display module is not mounted, the magnetic block 239 is disposed on top of the second mounting cavity 238 under the action of the third elastic resetting element 2313. In the case that the display module needs to be mounted, the mounting tool having magnetism is attached to the display side 11 of the display substrate 10 and makes the two magnets of different poles are aligned with each other. Under the magnetic attractive force, the magnetic block 239 slides in the second mounting cavity 238 and slides toward the side near the display side. In the case that the magnetic block 239 slides, the sliding bar 2311 slides on the bevel surface 2310 and slides in the middle of the magnetic block 239, such that the sliding bar 2311 pulls the first magnetic element 202 toward the second fixed housing 237, thereby changing the position of the first magnetic element 202 in the support element 201. FIG. 8 is a schematic diagram of a structure of a drive element according to an embodiment of the present disclosure. Referring to FIG. 8, in this case, the first magnetic element 202 is disposed at the end of the slot hole 211 near the second fixed housing 237 driven by the drive element 203.

Exemplarily, the second elastic resetting element 2312 and the third elastic resetting element 2313 may be compression springs.

Figure 9:
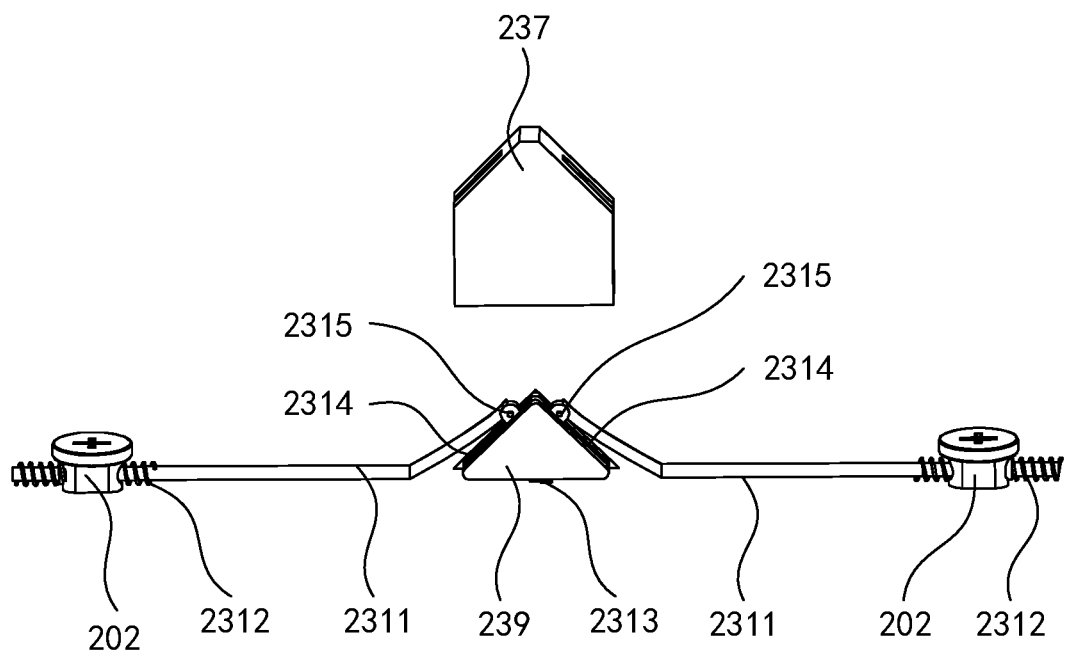
FIG. 9 is a schematic diagram of a structure of a drive element according to an embodiment of the present disclosure.

FIG. 9 is a schematic diagram of a structure of a drive element according to an embodiment of the present disclosure. Referring to FIG. 9, in the case that the display module is mounted and the mounting tool is removed from the display side 11, the first magnetic element 202 is moved toward the side distal from the second fixed housing 237 under the action of the second elastic resetting element 2312. In this case, the first magnetic element 202 is aligned with the second magnetic element in the casing, and the display module is fixed to the casing by the magnetic attractive force.

Referring again to FIGS. 8 and 9, the bevel surface 2310 has a chute 2314. The drive element 203 further includes a roller 2315. The roller 2315 is disposed within the second mounting cavity 238, and the roller 2315 is connected to one end of the sliding bar 2311, and the roller 2315 is disposed in the chute 2314.

In the embodiment, the roller 2315 is mounted at one end of the sliding bar 2311 to facilitate sliding of the sliding bar 2311.

One end of the sliding bar 2311 in the second mounting cavity 238 has a roller 2315, and the roller 2315 can slide on the chute 2314. In the initial state, the third elastic resetting element 2313 pushes the magnetic block 239 upward, and the roller 2315 interposed between the magnetic block 239 and the second fixed housing 237 cannot slide, such that the end of the sliding bar 2311 is disposed at the side of the second fixed housing 237 in the initial state. In the case that the drive element is mounted, the magnetic block 239 moves downward, the distance between the magnetic block 239 and the second fixed housing 237 increases, the roller 2315 can slide, and the sliding bar 2311 moves toward the middle of the second fixed housing 237, thus driving the first magnetic element 202 to move.

Figure 10:
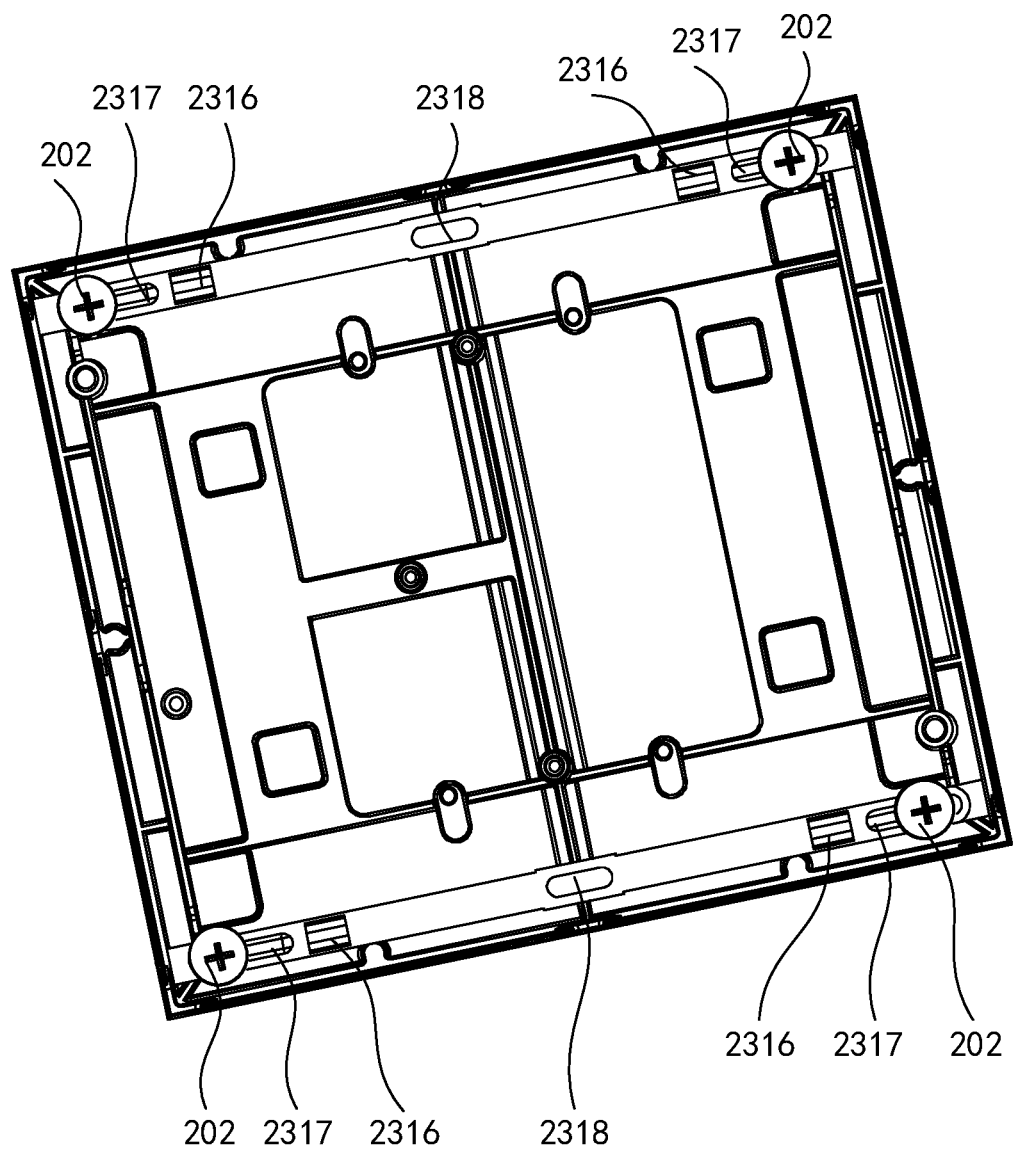
FIG. 10 is a schematic diagram of a structure of a display module according to an embodiment of the present disclosure.

FIG. 10 is a schematic diagram of the structure of a display module according to an embodiment of the present disclosure. Referring to FIG. 10, the drive element 203 includes a motor 2316, a screw 2317, and a power supply 2318. The motor 2316 is disposed on a side, distal from the display substrate 10, of the support element 201. One end of the screw 2317 is coaxially connected to a drive shaft of the motor 2316, and the other end of the screw 2317 is in threaded to the first magnetic element 202. The power supply 2318 is electrically connected to the motor 2316.

In the embodiment, the motor 2316 is configured to control the rotation of the screw 2317, causing the first magnetic element 202 on the screw 2317 to move.

For example, in the case that the motor 2316 rotates in a forward direction, the screw 2317 rotates in a forward direction, causing the first magnetic element 202 to move toward the middle of the display module. In response to placing the display module on the casing, the motor 2316 is controlled to rotate in a reverse direction and the screw 2317 rotates in a reverse direction, causing the first magnetic element 202 to move toward the edge of the display module, such that the first magnetic element 202 is aligned with the second magnetic element.

Exemplarily, the power supply 2318 may be powered by a printed circuit board or by a button battery.

Figure 11:
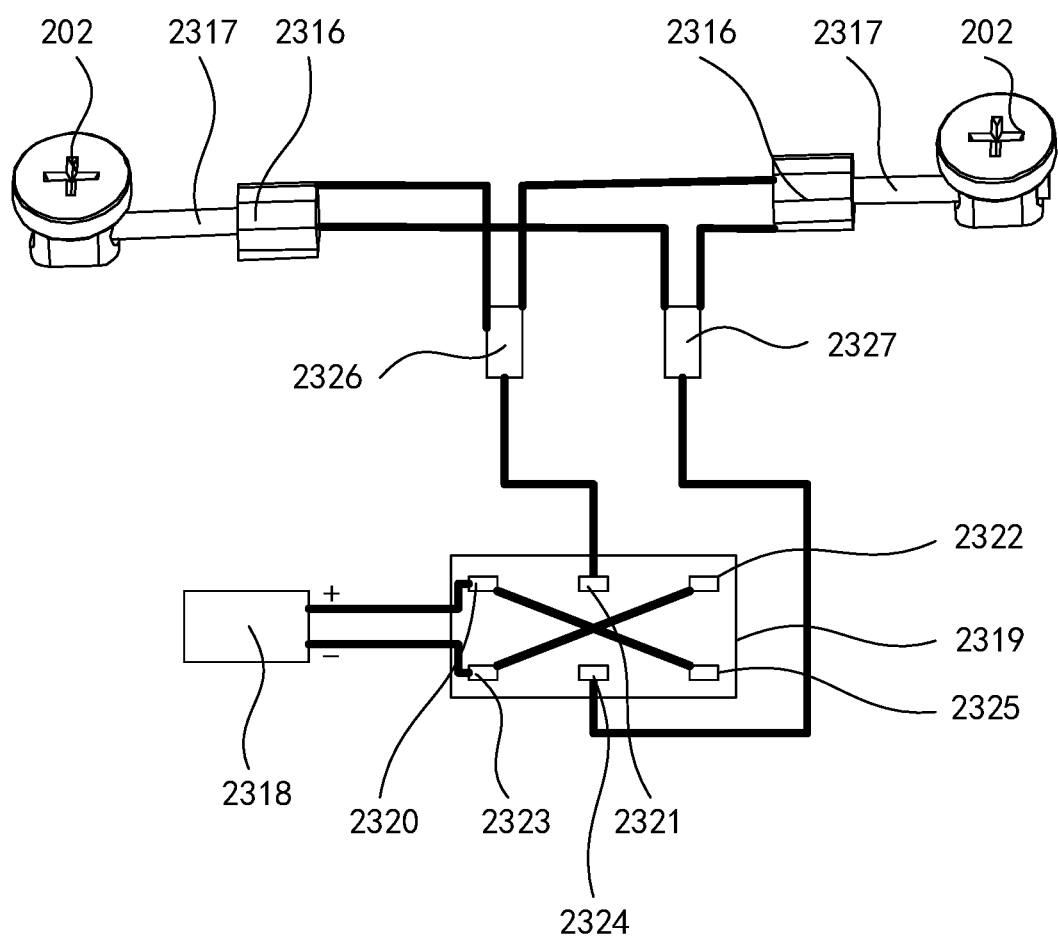
FIG. 11 is a schematic diagram of a structure of a drive element according to an embodiment of the present disclosure.

FIG. 11 is a schematic diagram of the structure of a drive element according to an embodiment of the present disclosure. Referring to FIG. 11, the drive element 203 further includes a control assembly 2319.

FIG. 12 is a schematic diagram of the structure of a control assembly according to an embodiment of the present disclosure. Referring to FIG. 12, the control assembly 2319 includes a first pin 2320, a second pin 2321, a third pin 2322, a fourth pin 2323, a fifth pin 2324, and a sixth pin 2325. Referring again to FIG. 11, the control assembly 2319 further includes a first lead 2326 and a second lead 2327, the first lead 2326 is electrically connected to the second pin 2321 and the motor 2316, and the second lead 2327 is electrically connected to the fifth pin 2324 and the motor 2316.

A positive pole of the power supply 2318 is electrically connected to the first pin 2320 and the sixth pin 2325 sequentially, and a negative pole of the power supply 2318 is electrically connected to the fourth pin 2323 and the third pin 2322 sequentially. In the case that the first pin 2320 is electrically connected to the second pin 2321 and the fourth pin 2323 is electrically connected to the fifth pin 2324, the motor 2316 is rotatable in a forward direction. In the case that the third pin 2322 is electrically connected to the second pin 2321, the fifth pin 2324 is electrically connected to the sixth pin 2325, the motor 2316 is rotatable in a reverse direction.

In the embodiment, in the case that the power supply is positively energized, the upper part of the electromagnetic coil on the mounting tool is S-pole and the lower part is N-pole, because it is repulsive for like poles and attractive for unlike poles, and the first pin 2320 is connected to the second pin 2321. The fourth pin 2323 is connected to the fifth pin 2324, such that the motor is rotatable in the forward direction.

In the case that the power supply is negatively energized, the upper part of the electromagnetic coil on the mounting tool is N-pole and the lower part is S-pole, because it is repulsive for like poles and attractive for unlike poles, and the third pin 2322 is connected to the second pin 2321. The sixth pin 2325 is connected to the fifth pin 2324, such that the motor is rotatable in the reverse direction.

Referring again to FIG. 12, the drive element 203 further includes a first link 2328, two first springs 2329, a second link 2330, and two second springs 2331.

A middle portion of the first link 2328 is electrically connected to the second pin 2321, and both ends of the first link 2328 are aligned with the first pin 2320 and the third pin 2322 respectively. The two first springs 2329 are both connected to the first link 2328, the two first springs 2329 are disposed between the first pin 2320 and the third pin 2322, and the second pin 2321 is disposed between the two first springs 2329. A middle portion of the second link 2330 is electrically connected to the fifth pin 2324, and both ends of the second link 2330 are aligned with the fourth pin 2323 and the sixth pin 2325 respectively. Both second springs 2331 are connected to the second link 2330, and the two second springs 2331 are disposed between the fourth pin 2323 and the sixth pin 2325, and the fourth pin 2323 is disposed between the two second springs 2331.

A magnetic pole of the first link 2328 is the same as a magnetic pole of the second link 2330 at an end disposed on an identical side, and the magnetic poles of opposite ends of the first link 2328 are opposite. That is, the end of the first link 2328 aligning with the first pin 2320 is S or N pole, the end of the first link 2328 aligning with the third pin 2322 is S or N pole, the end of the second link 2330 aligning with the fourth pin 2323 has the same magnetic pole as the end of the first link 2338 aligning with the first pin 2320, and the end of the second link 2330 aligning with the sixth pin 2325 has the same magnetic pole as the end of the first link 2328 aligning with the third pin 2322.

It is explained by the examples that the end of the first link 2328 aligning with the first pin 2320 is N-pole, the end of the first link 2328 aligning with the third pin 2322 is S-pole, the end of the second link 2330 aligning with the fourth pin 2323 is N-pole, and the end of the second link 2330 aligning with the sixth pin 2325 is S-pole.

In the embodiment, both the first link 2328 and the second link 2330 form a lever structure, and in the initial state, the two ends of the first link 2328 are not connected to the first pin 2320 and the third pin 2322, and the two ends of the second link 2330 are not connected to the fourth pin 2323 and the sixth pin 2325. In the case that the display module is mounted, the upper part of the electromagnetic coil on the mounting tool is S-pole and the lower part is N-pole, because it is repulsive for like poles and attractive for unlike poles, and the first pin 2320 is connected to the second pin 2321. The fourth pin 2323 is connected to the fifth pin 2324, and the motor rotates in the forward direction, causing the first magnetic element 202 to move toward the middle of the display module. In response to the display module being mounted, the magnetism of the mounting tool is changed. The upper part of the electromagnetic coil on the mounting tool is N-pole and the lower part is S-pole, because it is repulsive for like poles and attractive for unlike poles, and the third pin 2322 is connected to the second pin 2321, the sixth pin 2325 is connected to the fifth pin 2324, and the motor rotates in the reverse direction, causing the first magnetic element 202 to move toward the edge of the display module.

Embodiments of the present disclosure further provide a method for disassembling/assembling a display module, the method being applicable to stitch the above display module. FIG. 13 is a flowchart of a disassembly method of a display module according to an embodiment of the present disclosure. Referring to FIG. 13, the method includes the followings.

In step S1301, the drive element controls a position of the first magnetic element relative to the support element, such that the first magnetic element moves out of an initial position, wherein the initial position is a position where the display module is disposed on the casing and magnetically connected to the second magnetic element of the casing.

Exemplarily, a mounting tool may be used to control the drive element. The mounting tool may be a suction cup having a magnet, such that the mounting tool can attach the display module.

In step S1302, the display module is placed on the casing or removed from the casing.

Exemplarily, the display module is placed at the corresponding position on the case by the mounting tool. In the case that the display module is placed on or removed from the case, the mounting tool can be removed from the display module.

In the embodiments, the first magnetic element in the display module is magnetically connected to the second magnetic element in the casing. In the case that the display module is mounted, the position of the first magnetic element in the support element is changed by the driving element, such that the position of the first magnetic element is staggered from the position of the second magnetic element in the casing, and the magnetic attractive force between the first magnetic element and the second magnetic element is reduced. In the case that the display module is close to the casing, the display module is not instantly attracted to the casing because of the larger magnetic attractive force, which can reduce the possibility of damage to the display module during the mounting process.

The method provided by the embodiment of the present disclosure can be applied to disassemble/assemble a display module having the same type or a plurality of different types, wherein the display substrate in the display module can be any one of a liquid crystal display panel, an organic electroluminescent display substrate, a quantum dot display substrate, an electronic paper display panel, etc.

Exemplarily, the casing is provided with a mounting region for mounting and fixing the display module. For example, eight display modules (1-1, 1-2, 1-3, 1-4, 1-5, 1-6,

1-7, 1-8) are provided, and the casing has eight mounting regions arranged in two rows and four columns. Firstly, the display module 1-1 is mounted on the mounting region of the first column and second row of the casing, and the position of the display module 1-1 is adjusted, such that the display module 1-1 is firmly mounted on the casing. Secondly, the display module 1-2, the display module 1-3, the display module 1-4 are mounted on the corresponding mounting regions of the second row of the casing along the long side of the casing, and the positions of the display module 1-2, the display module 1-3 and the display module 1-4 are adjusted sequentially. Next, the display module 1-5 is mounted on the mounting region of the casing of the first row and first column, and the position of display module 1-5 is adjusted, such that the display module 1-5 is firmly mounted on the casing. Finally, the display module 1-6, the display module 1-7, and the display module 1-8 are mounted on the corresponding mounting regions of the first row of the casing along the long side of the casing, and the positions of the display module 1-6, the display module 1-7, and the display module 1-8 are adjusted. Eventually, a stitching display device including 8 display modules is completed by stitching.

Embodiments of the present disclosure further provide a display device. The display device includes a casing and a plurality of display modules, wherein at least one of the plurality of display modules is the display module of any one of above, and the plurality of display modules are stitched on the casing.

Figure 14:
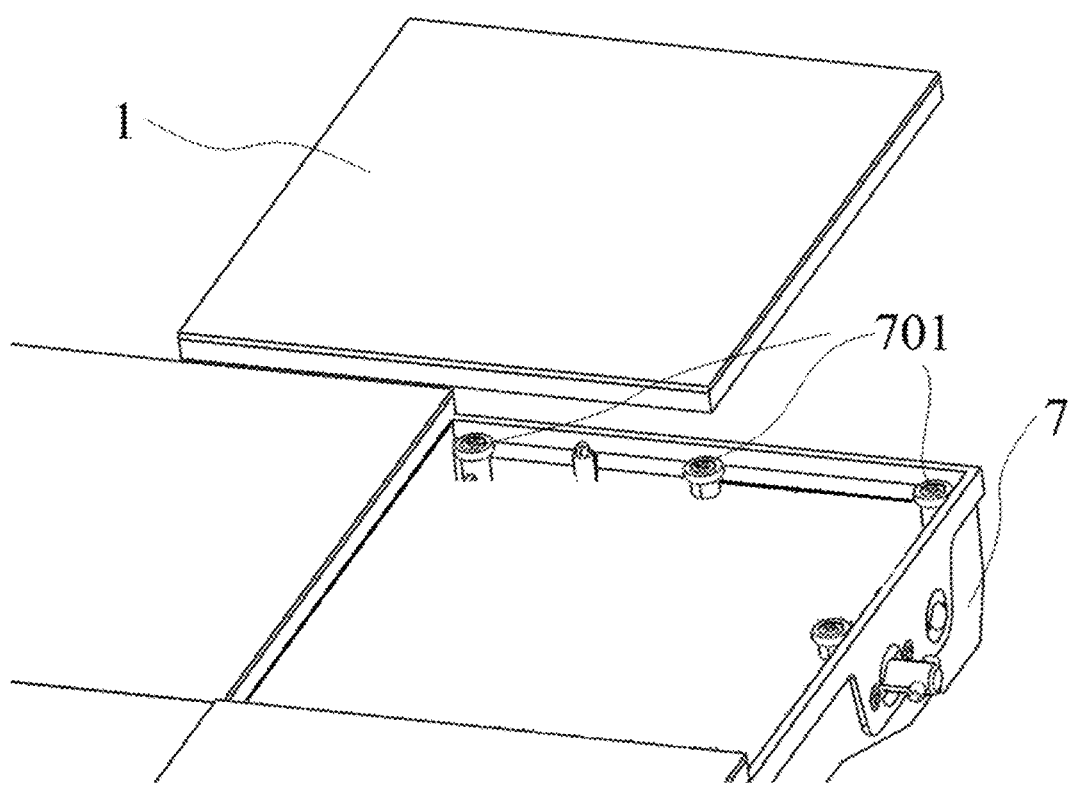
FIG. 14 is a schematic diagram of a structure of a display device according to an embodiment of the present disclosure.

FIG. 14 is a schematic diagram of a structure of a display device according to an embodiment of the present disclosure. Referring to FIG. 14, the display device includes a casing 7 and a plurality of display modules 1. Any one of the plurality of display modules 1 is a display module 1 of any of the above, and the plurality of display modules 1 are stitched on the casing Z.

The casing 7 provides a carrying surface for the plurality of display modules 1 for mounting the display modules. The casing 7 has a plurality of second magnetic elements 701. In the case that the display module 1 is stitched on the casing 7, the second magnetic elements 701 are positioned aligning with the first magnetic elements, and the display module 1 is fixed to the casing 7 by magnetic attractive force between the first magnetic elements and the second magnetic elements 701.

In practice, the display device provided by the embodiments of the present disclosure may be any product or assembly with display function, such as a mobile phone, a tablet computer, a television, a display screen, a laptop computer, a digital camera, a navigator, etc.

The above is only an optional embodiment of the present disclosure and is not intended to limit the present disclosure. Any modification, equivalent replacement, improvement, etc. made within the spirit and principles of the present disclosure shall be included in the scope of protection of the present disclosure.

What is claimed is:

1. A display module, comprising:
    a display substrate, having a display side and a back side opposite the display side; and
    a support assembly, stacked on the back side and comprising a support element, a first magnetic element and a drive element, wherein the first magnetic element and the drive element are both disposed on the support element, and the first magnetic element is connected to the drive element;
    wherein the first magnetic element is configured to be connected to a second magnetic element in a casing, and the drive element is configured to change a position of the first magnetic element relative to the support element, the support assembly is configured to support the display substrate, and the support element is configured to provide a mounting space for the first magnetic element and the driver element.

2. The display module according to claim 1, wherein the support element is a rectangular plate, and the support assembly comprises four first magnetic elements and two drive elements, the four first magnetic elements being disposed on four corners of the support element respectively, and the two drive elements being disposed on two opposite sides of the support element respectively;
    wherein one of the two drive elements is connected to two of the four first magnetic elements, and the other of the two drive elements is connected to the other two of the four first magnetic elements.

3. The display module according to claim 2, wherein the drive element is connected to the two first magnetic elements disposed on a side where the drive element is disposed.

4. The display module according to claim 1, wherein the drive element comprises:
    a first fixed housing, disposed on a side, distal from the display substrate, of the support element, wherein the first fixed housing is fixedly connected to the support element, and the first fixed housing comprises a first mounting cavity;
    a magnet, movably disposed within the first mounting cavity, wherein a moving direction of the magnet is perpendicular to the back side;
    a connection element, having flexibility and an elongated shape, wherein at least one end of the connection element is connected to the first magnetic element, and the connection element is in contact with a side, distal from the display substrate, of the magnet; and
    a first elastic resetting element, disposed between the first magnetic element and the first fixed housing, wherein both ends of the first resilient resetting element are abutted against the first magnetic element and the support element respectively.

5. The display module according to claim 4, wherein the drive element further comprises:
    a guide bar, wherein one end of the guide bar is connected to an end of the connection element, the other end of the guide bar is connected to the first magnetic element, and the first elastic resetting element is sleeved on the guide bar.

6. The display module according to claim 1, wherein the drive element comprises:
    a second fixed housing, disposed on a side, distal from the display substrate, of the support element, wherein the second fixed housing is fixedly connected to the support element, and the second fixed housing comprises a second mounting cavity;
    a magnetic block, movably disposed within the second mounting cavity, wherein a moving direction of the magnetic block moving is perpendicular to the back side, and a surface, distal from the display side, of the magnetic block is a bevel surface;
    a sliding bar, wherein one end of the sliding bar is disposed on the bevel surface, and the other end of the sliding bar is connected to the first magnetic element;
    a second elastic resetting element, disposed between the first magnetic element and the second fixed housing, wherein both ends of the second elastic resetting element are abutted against the first magnetic element and the support element respectively; and
a third elastic resetting element, disposed within the second mounting cavity and between the magnetic block and the support element, wherein both ends of the third elastic resetting element are abutted against the magnetic block and the support element respectively.

7. The display module according to claim 6, wherein a chute is disposed in the bevel surface, and the drive element further comprises:
a roller, disposed within the second mounting cavity, wherein the roller is connected to one end of the sliding bar, and the roller is disposed in the chute.

8. The display module according to claim 1, wherein the drive element comprises:
a motor, disposed on a side, distal from the display substrate, of the support element;
a screw, wherein one end of the screw is coaxially connected to a drive shaft of the motor, and the other end of the screw is in threaded to the first magnetic element; and
a power supply, electrically connected to the motor.

9. The display module according to claim 8, wherein the drive element further comprises:
a control assembly, comprising a first pin, a second pin, a third pin, a fourth pin, a fifth pin, a sixth pin, a first lead, and a second lead, wherein the first lead is electrically connected to the second pin and the power supply, and the second lead is electrically connected to the fifth pin and the power supply;
wherein a positive pole of the power supply is electrically connected to the first pin and the sixth pin sequentially, and a negative pole of the power supply is electrically connected to the fourth pin and the third pin sequentially; in the case that the first pin is electrically connected to the second pin, and the fourth pin is electrically connected to the fifth pin, the motor is rotatable in a forward direction; and in the case that the third pin is electrically connected to the second pin, and the fifth pin is electrically connected to the sixth pin, the motor is rotatable in a reverse direction.

10. The display module according to claim 9, wherein the drive element further comprises:
a first link, wherein a middle portion of the first link is electrically connected to the second pin, and both ends of the first link are aligned with the first pin and the third pin respectively;
two first springs, connected to the first link and disposed between the first pin and the third pin, wherein the second pin is disposed between the two first springs;
a second link, wherein a middle portion of the second link is electrically connected to the fifth pin, and both ends of the second link are aligned with the fourth pin and the sixth pin respectively; and
two second springs, connected to the second link and disposed between the fourth pin and the sixth pin, wherein the fourth pin is disposed between the two second springs;
wherein a magnetic pole of the first link is the same as a magnetic pole of the second link at an end disposed on an identical side, and the magnetic poles of opposite ends of the first link are opposite.

11. The display module according to claim 1, wherein a slot hole for the first magnetic element to slide therein is disposed on the support element, and one end of the first magnetic element is disposed in the slot hole.

12. The display module according to claim 11, wherein the slot hole is an oblong hole, and a length of the slot hole ranges from 10 mm to 20 mm.

13. The display module according to claim 1, wherein the first magnetic element is an iron nail.

14. A method for disassembling/assembling a display module, applicable to disassembling/assembling a display module, wherein the display module comprises:
a display substrate, having a display side and a back side opposite the display side; and
a support assembly, stacked on the back side and comprising a support element, a first magnetic element and a drive element, wherein the first magnetic element and the drive element are both disposed on the support element, and the first magnetic element is connected to the drive element; wherein the first magnetic element is configured to be connected to a second magnetic element in a casing, and the drive element is configured to change a position of the first magnetic element relative to the support element; and
the method comprises:
controlling, by the drive element, the position of the first magnetic element relative to the support element, such that the first magnetic element moves out of an initial position, wherein the initial position is a position where the display module is disposed on the casing and magnetically connected to the second magnetic element of the casing; and
placing the display module on the casing or removing the display module from the casing, the support assembly is configured to support the display substrate, and the support element is configured to provide a mounting space for the first magnetic element and the driver element.

15. A display device, comprising a casing and a plurality of display modules, wherein at least one of the plurality of display modules comprises:
a display substrate, having a display side and a back side opposite the display side; and
a support assembly, stacked on the back side and comprising a support element, a first magnetic element and a drive element, wherein the first magnetic element and the drive element are both disposed on the support element, and the first magnetic element is connected to the drive element;
wherein the first magnetic element is configured to be connected to a second magnetic element in the casing, and the drive element is configured to change a position of the first magnetic element relative to the support element; and
the plurality of display modules are stitched on the casing, the support assembly is configured to support the display substrate, and the support element is configured to provide a mounting space for the first magnetic element and the driver element.

16. The display device according to claim 15, wherein the support element is a rectangular plate, and the support assembly comprises four first magnetic elements and two drive elements, the four first magnetic elements being disposed on four corners of the support element respectively, and the two drive elements being disposed on two opposite sides of the support element respectively;
wherein one of the two drive elements is connected to two of the four first magnetic elements, and the other of the two drive elements is connected to the other two of the four first magnetic elements.

17. The display device according to claim 16, wherein the drive element is connected to the two first magnetic elements disposed on a side where the drive element is disposed.

18. The display device according to claim 15, wherein the drive element comprises:
- a first fixed housing, disposed on a side, distal from the display substrate, of the support element, wherein the first fixed housing is fixedly connected to the support element, and the first fixed housing comprises a first mounting cavity;
- a magnet, movably disposed within the first mounting cavity, wherein a moving direction of the magnet is perpendicular to the back side;
- a connection element, having flexibility and an elongated shape, wherein at least one end of the connection element is connected to the first magnetic element, and the connection element is in contact with a side, distal from the display substrate, of the magnet; and
- a first elastic resetting element, disposed between the first magnetic element and the first fixed housing, wherein both ends of the first resilient resetting element are abutted against the first magnetic element and the support element respectively.

19. The display device according to claim 18, wherein the drive element further comprises:
- a guide bar, wherein one end of the guide bar is connected to an end of the connection element, the other end of the guide bar is connected to the first magnetic element, and the first elastic resetting element is sleeved on the guide bar.

20. The display device according to claim 15, wherein the drive element comprises:
- a second fixed housing, disposed on a side, distal from the display substrate, of the support element, wherein the second fixed housing is fixedly connected to the support element, and the second fixed housing comprises a second mounting cavity;
- a magnetic block, movably disposed within the second mounting cavity, wherein a moving direction of the magnetic block moving is perpendicular to the back side, and a surface, distal from the display side, of the magnetic block is a bevel surface;
- a sliding bar, wherein one end of the sliding bar is disposed on the bevel surface, and the other end of the sliding bar is connected to the first magnetic element;
- a second elastic resetting element, disposed between the first magnetic element and the second fixed housing, wherein both ends of the second elastic resetting element are abutted against the first magnetic element and the support element respectively; and
- a third elastic resetting element, disposed within the second mounting cavity and between the magnetic block and the support element, wherein both ends of the third elastic resetting element are abutted against the magnetic block and the support element respectively.

* * * * *